(12) United States Patent
Murata (10) Patent No.: US 11,791,193 B2
(45) Date of Patent: Oct. 17, 2023

(54) INDUSTRIAL ROBOT

(71) Applicant: NIDEC SANKYO CORPORATION, Nagano (JP)

(72) Inventor: Wataru Murata, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 17/489,758

(22) Filed: Sep. 29, 2021

(65) Prior Publication Data

US 2022/0108911 A1 Apr. 7, 2022

(30) Foreign Application Priority Data

Oct. 2, 2020 (JP) ................................ 2020-167862

(51) Int. Cl.
*H01L 21/687* (2006.01)
*H01L 21/67* (2006.01)
*B25J 9/16* (2006.01)
*B25J 13/08* (2006.01)

(52) U.S. Cl.
CPC ...... *H01L 21/68707* (2013.01); *B25J 9/1656* (2013.01); *B25J 13/08* (2013.01); *H01L 21/67259* (2013.01)

(58) Field of Classification Search
CPC .......... H01L 21/68707; H01L 21/67259; B25J 9/1656; B25J 13/08
See application file for complete search history.

(56) References Cited

U.S. PATENT DOCUMENTS

| | | | | |
|---|---|---|---|---|
| 6,615,113 | B2* | 9/2003 | Kretz | H01L 21/67271 414/935 |
| 8,112,177 | B2* | 2/2012 | Adachi | H01L 21/67742 414/730 |
| 8,731,718 | B2* | 5/2014 | Rodnick | B25J 9/1612 700/258 |
| 2005/0281661 | A1* | 12/2005 | Kesil | B25J 9/1633 414/744.5 |
| 2009/0093908 | A1* | 4/2009 | Hashimoto | H01L 21/67259 901/33 |
| 2016/0158935 | A1 | 6/2016 | Inomata et al. | |
| 2017/0173797 | A1 | 6/2017 | Inomata et al. | |
| 2017/0274534 | A1* | 9/2017 | Takahashi | B25J 9/1641 |
| 2018/0015620 | A1* | 1/2018 | Nakaya | B25J 19/063 |
| 2019/0189480 | A1* | 6/2019 | Yamasaki | C25D 21/12 |

FOREIGN PATENT DOCUMENTS

JP 2016107378 6/2016

* cited by examiner

*Primary Examiner* — Gerald McClain
(74) *Attorney, Agent, or Firm* — JCIPRNET (57) ABSTRACT

A first sensor is disposed in such a way that optical axes of a light emitting element and a light receiving element thereof are parallel to a left-right direction. A second sensor is disposed in such a way that optical axes of a light emitting element and a light receiving element thereof are parallel to a front-rear direction. When a position of a wafer to be loaded on a loading portion is taught, a position of the loading portion or a teaching jig to be loaded on the loading portion in the front-rear direction is detected by the first sensor by moving a hand in the front-rear direction by a moving mechanism, and a position of the loading portion or the teaching jig in the left-right direction is detected by the second sensor by moving the hand in the left-right direction by the moving mechanism.

4 Claims, 8 Drawing Sheets

INDUSTRIAL ROBOT

CROSS REFERENCE TO RELATED APPLICATION

The present invention claims priority under 35 U.S.C. § 119 to Japanese Application No. 2020-167862 filed Oct. 2, 2020, and the entire content of which is incorporated herein by reference.

BACKGROUND

Field of the Invention

At least an embodiment of the present invention relates to an industrial robot.

Description of the Related Documents

Conventionally, an industrial robot that transports semiconductor wafers is known (see, for example, Japanese Unexamined Patent Application Publication No. 2016-107378). Japanese Unexamined Patent Application Publication No. 2016-107378 describes an industrial robot that automatically teaches a position of a transport object to be loaded on a loading portion. The industrial robot in Japanese Unexamined Patent Application Publication No. 2016-107378 includes a first sensor having a light emitting element and a light receiving element whose optical axes are parallel to a left-right direction, and a second sensor having a light emitting element and a light receiving element whose optical axes are inclined with respect to a front-rear direction and a left-right direction, and are horizontal.

SUMMARY

In the conventional configuration, when one sensor for teaching is provided on a hand, it is necessary to perform sensing a plurality of times, while changing the entry angle of the hand. This increases a moving range of the hand, and requires to secure a large space for teaching.

In the configuration of Japanese Unexamined Patent Application Publication No. 2016-107378, for example, when there is a plurality of objects to be taught, it is necessary to perform sensing a plurality of times, while changing the entry position of the hand. This increases a moving range of the hand, and requires to secure a large space for teaching.

In view of the above circumstances, at least an embodiment of the present invention provides an industrial robot capable of teaching in a narrow place.

An industrial robot according to at least an embodiment of the present invention is an industrial robot that carries a transport object into a loading portion where the transport object is loaded and carries the transport object out of the loading portion. The industrial robot includes: a hand that grips the transport object, and linearly moves in a horizontal direction; a moving mechanism that moves the hand in a first direction and a second direction, wherein a moving direction of the hand when the transport object is transported to the loading portion is set as the first direction, and a direction orthogonal to the first direction and a vertical direction is set as the second direction; and a first sensor and a second sensor including a light emitting element and a light receiving element, and mounted on the hand. The first sensor is disposed in such a way that an optical axis of the light emitting element and an optical axis of the light receiving element of the first sensor are parallel to the second direction. The second sensor is disposed in such a way that an optical axis of the light emitting element and an optical axis of the light receiving element of the second sensor are parallel to the first direction. When a position of the transport object to be loaded on the loading portion is taught, a position of the loading portion or a teaching jig to be loaded on the loading portion in the first direction is detected by the first sensor by moving the hand in the first direction by the moving mechanism, and a position of the loading portion or the teaching jig in the second direction is detected by the second sensor by moving the hand in the second direction by the moving mechanism.

According to at least an embodiment of the present invention, it is possible to provide an industrial robot capable of teaching in a narrow place.

DETAILED DESCRIPTION

In the following, an embodiment according to the present invention is described with reference to the drawings.

[Configuration of Industrial Robot]

Figure 1:
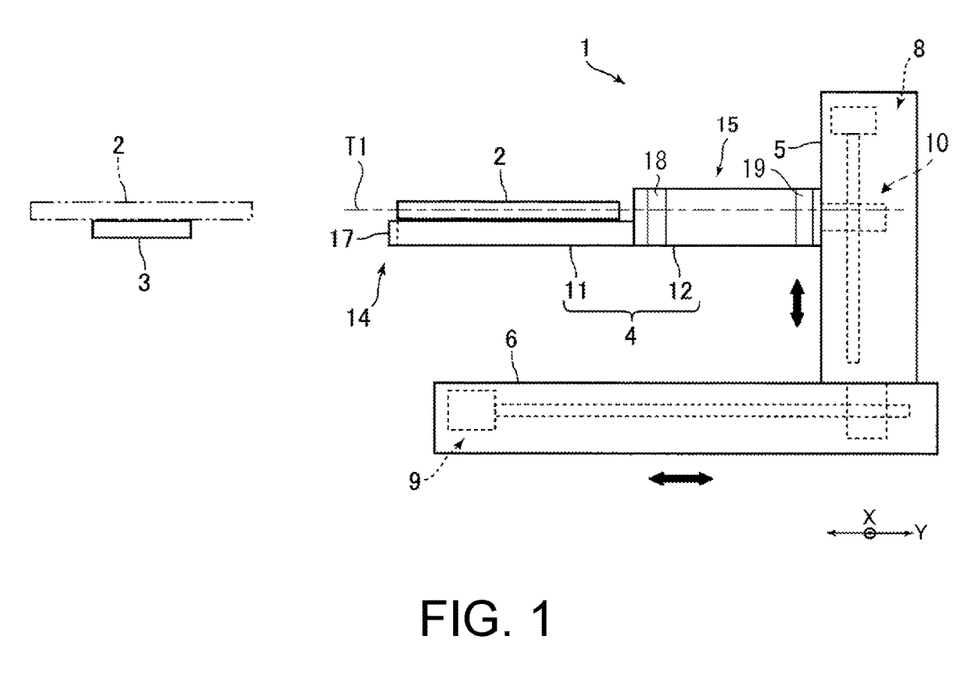
FIG. 1 is a side view showing a schematic configuration of an industrial robot 1 according to an embodiment of the present invention.
Figure 2:
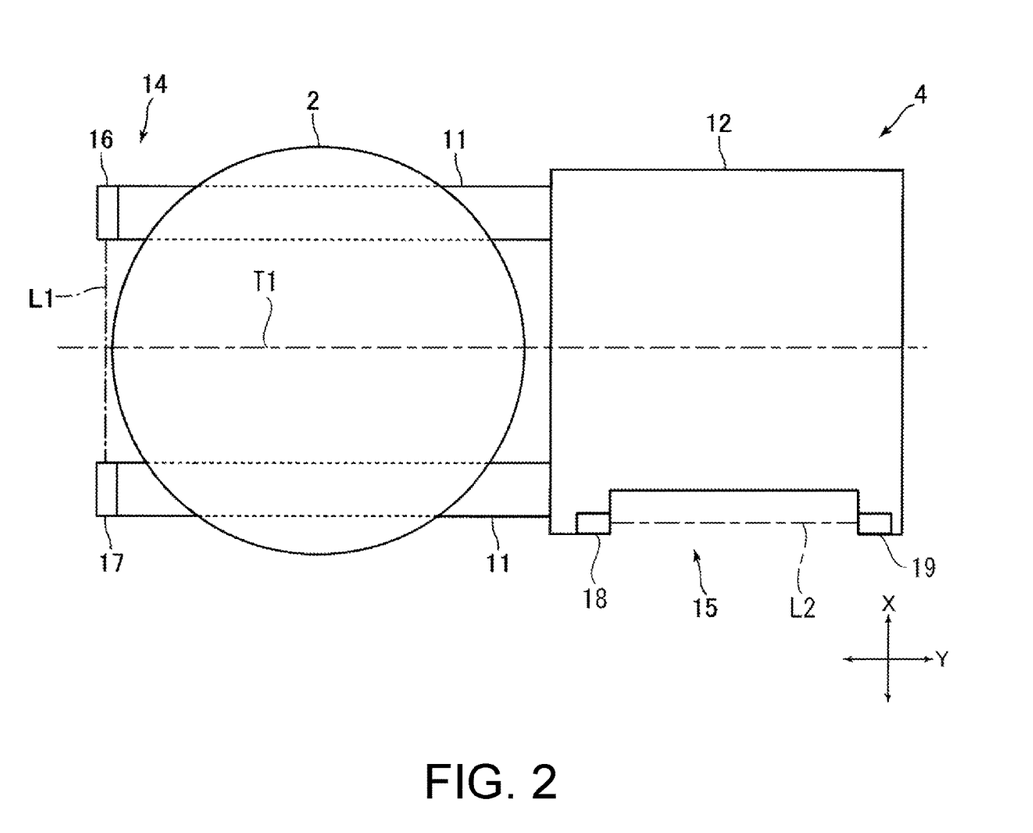
FIG. 2 is a plan view of a hand 4 shown in FIG. 1.
Figure 3:
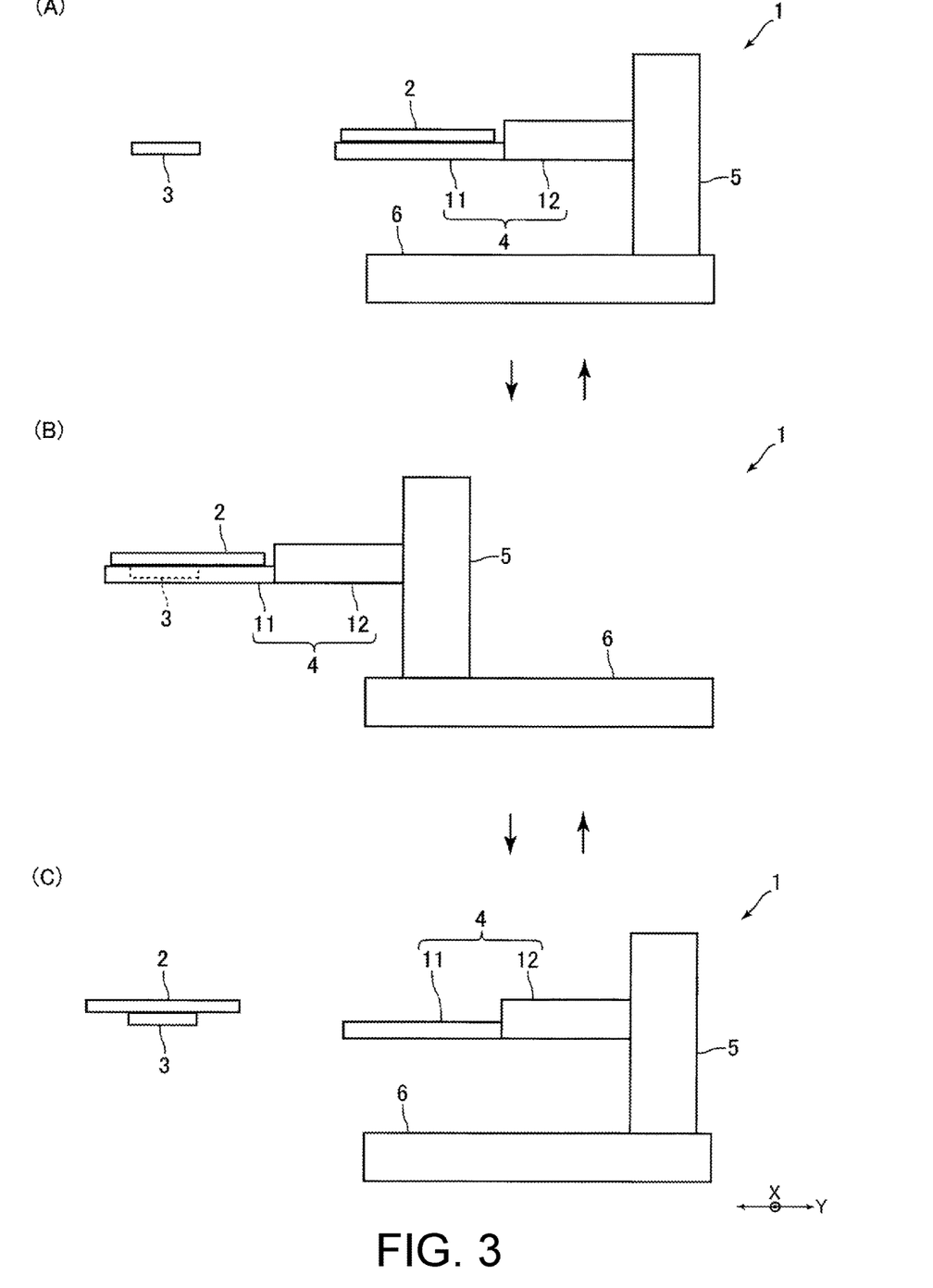
FIG. 3 is a diagram showing an operation of the industrial robot 1 shown in FIG. 1.

FIG. 1 is a side view showing a schematic configuration of an industrial robot 1 according to an embodiment of the present invention. FIG. 2 is a plan view of a hand 4 shown in FIG. 1. FIG. 3 is a diagram showing an operation of the industrial robot 1 shown in FIG. 1.

The industrial robot 1 according to the present embodiment (hereinafter, referred to as the "robot 1") is a robot that transports a semiconductor wafer 2 (hereinafter, referred to as the "wafer 2"), which is a transport object. Specifically, the robot 1 is a robot that carries the wafer 2 into a loading portion 3 where the wafer 2 is loaded, and carries the wafer 2 out of the loading portion 3. The wafer 2 is formed into a disk shape. The loading portion 3 is disposed, for example, inside a processing device that performs predetermined processing with respect to the wafer 2. The loading portion 3 according to the present embodiment is also formed into a disk shape.

The robot 1 includes the hand 4 that grips the wafer 2, a pillar portion 5 that holds the hand 4 to be raised and lowered, a base portion 6 that holds the pillar portion 5 to be movable in a horizontal direction, and an elevation mechanism 8 that raises and lowers the hand 4 with respect to the pillar portion 5. The robot 1 also includes a moving mechanism 9 that linearly moves the hand 4 and the pillar portion 5 in the horizontal direction with respect to the base portion 6, and the hand 4 linearly moves in the horizontal direction when transporting the wafer 2.

In the following description, it is assumed that a direction parallel to the direction of gravity is a vertical direction. In addition, it is assumed that a moving direction (Y direction shown in FIG. 1 and the like) of the hand 4 when the wafer 2 is transported to the loading portion 3 (specifically, when the wafer 2 is carried into the loading portion 3 and the wafer 2 is carried out of the loading portion 3) is a front-rear direction. In addition, it is assumed that a direction (X direction shown in FIG. 1 and the like) orthogonal to the vertical direction and the front-rear direction is a left-right direction. In the present embodiment, the front-rear direction is a first direction, and the left-right direction is a second direction.

The pillar portion 5 is formed into a pillar shape extending in the vertical direction. The elevation mechanism 8 includes, for example, a ball screw rotatably mounted on the pillar portion 5, a nut member engaged with the ball screw and fixed to the hand 4, a motor that rotates the ball screw, and a guide portion that guides the hand 4 in the vertical direction. The elevation mechanism 8 is disposed inside the pillar portion 5, which is formed into a hollow shape.

The base portion 6 is formed into a block shape extending in the front-rear direction. The moving mechanism 9 includes, for example, a ball screw rotatably mounted on the base portion 6, a nut member engaged with the ball screw and fixed to the pillar portion 5, a motor that rotates the ball screw, and a guide portion that guides the pillar portion 5 in the front-rear direction. The moving mechanism 9 is disposed inside the base portion 6, which is formed into a hollow shape, and moves the hand 4 and the pillar portion 5 in the front-rear direction. The moving mechanism 9 also includes a mechanism that moves the pillar portion 5 in the left-right direction.

The hand 4 is rotatable around a rotation axis T1 parallel to the front-rear direction. For example, the pillar portion 5 includes a rotation mechanism 10 such as a motor that rotates the hand 4 around the rotation axis T1 with respect to the pillar portion 5.

The hand 4 includes, for example, two fork portions 11 formed into a rod shape, and a fork support portion 12 to which base ends of the fork portions 11 are mounted. The fork portions 11 are formed into a linear shape. The two fork portions 11 are disposed substantially parallel to each other and with a predetermined distance in the left-right direction. The distance between the two fork portions 11 is larger than the diameter of the loading portion 3. In addition, the two fork portions 11 are disposed at the same position in the vertical direction. As shown in FIG. 2, the wafer 2 is mounted on upper surfaces of the two fork portions 11. A grip mechanism (not shown) that grips the wafer 2 is mounted on the upper surface of the fork portion 11. The fork support portion 12 is formed into a block shape, and is held on the pillar portion 5 to be raised and lowered.

As shown in FIG. 2, a first sensor 14 and a second sensor 15 are mounted on the hand 4. The first sensor 14 is a transmissive optical sensor including a light emitting portion 16 having a light emitting element, and a light receiving portion 17 having a light receiving element. Likewise, the second sensor 15 is a transmissive optical sensor including a light emitting portion 18 having a light emitting element, and a light receiving portion 19 having a light receiving element.

The light emitting portion 16 is mounted on a distal end of one of the two fork portions 11, and the light receiving portion 17 is mounted on a distal end of the other of the two fork portions 11. The light emitting portion 16 and the light receiving portion 17 are disposed in such a way as to face each other in the left-right direction. Specifically, the first sensor 14 is disposed in such a way that optical axes L1 of the light emitting portion 16 and the light receiving portion 17 (specifically, optical axes of the light emitting element of the light emitting portion 16 and the light receiving element of the light receiving portion 17) are parallel to the left-right direction.

The light emitting portion 18 and the light receiving portion 19 are mounted on a side portion of the hand 4, specifically on a left surface of both side surfaces of the fork support portion 12. In the example of FIG. 2, the light emitting portion 18 and the light receiving portion 19 are mounted on both ends of a recess formed in a side portion of the hand 4. Alternatively, the light emitting portion 18 and the light receiving portion 19 may be mounted on two projections formed on a side portion of the hand 4.

The light emitting portion 18 and the light receiving portion 19 are disposed in such a way as to face each other in the front-rear direction. Specifically, the second sensor 15 is disposed in such a way that optical axes L2 of the light emitting portion 18 and the light receiving portion 19 (specifically, optical axes of the light emitting element of the light emitting portion 18 and the light receiving element of the light receiving portion 19) are parallel to the front-rear direction. Also, the distance between the light emitting portion 18 and the light receiving portion 19 is larger than the diameter of the loading portion 3.

The robot 1 configured as described above carries the wafer 2 into the loading portion 3 and carries the wafer 2 out of the loading portion 3, as shown in (A) to (C) of FIG. 3, by combination of vertical movement and horizontal movement in the front-rear direction of the hand 4.

[Method of Teaching Position of Wafer to be Loaded on Loading Portion]

Figure 4:
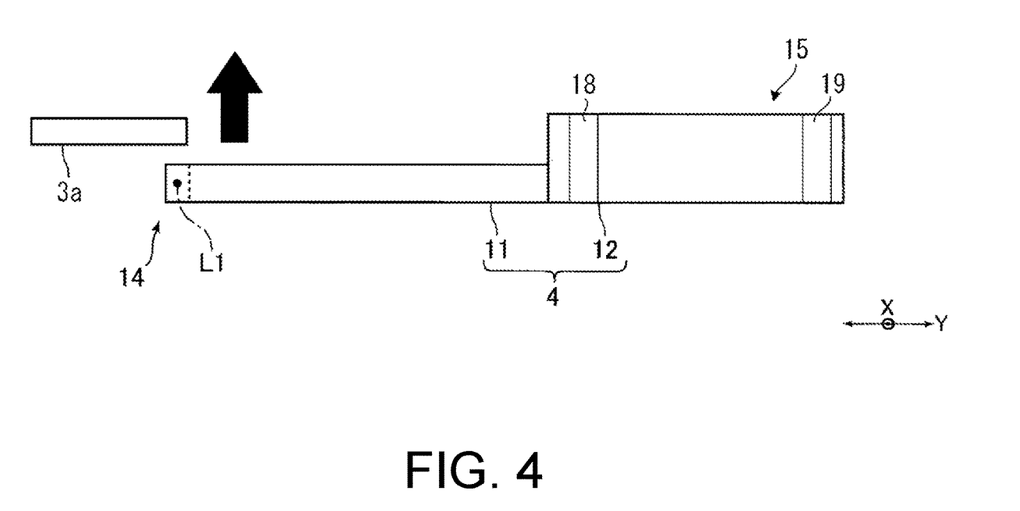
FIG. 4 is a diagram showing an operation of the hand 4 when the robot 1 shown in FIG. 1 detects a position of a first loading portion 3a in a vertical direction.
Figure 5:
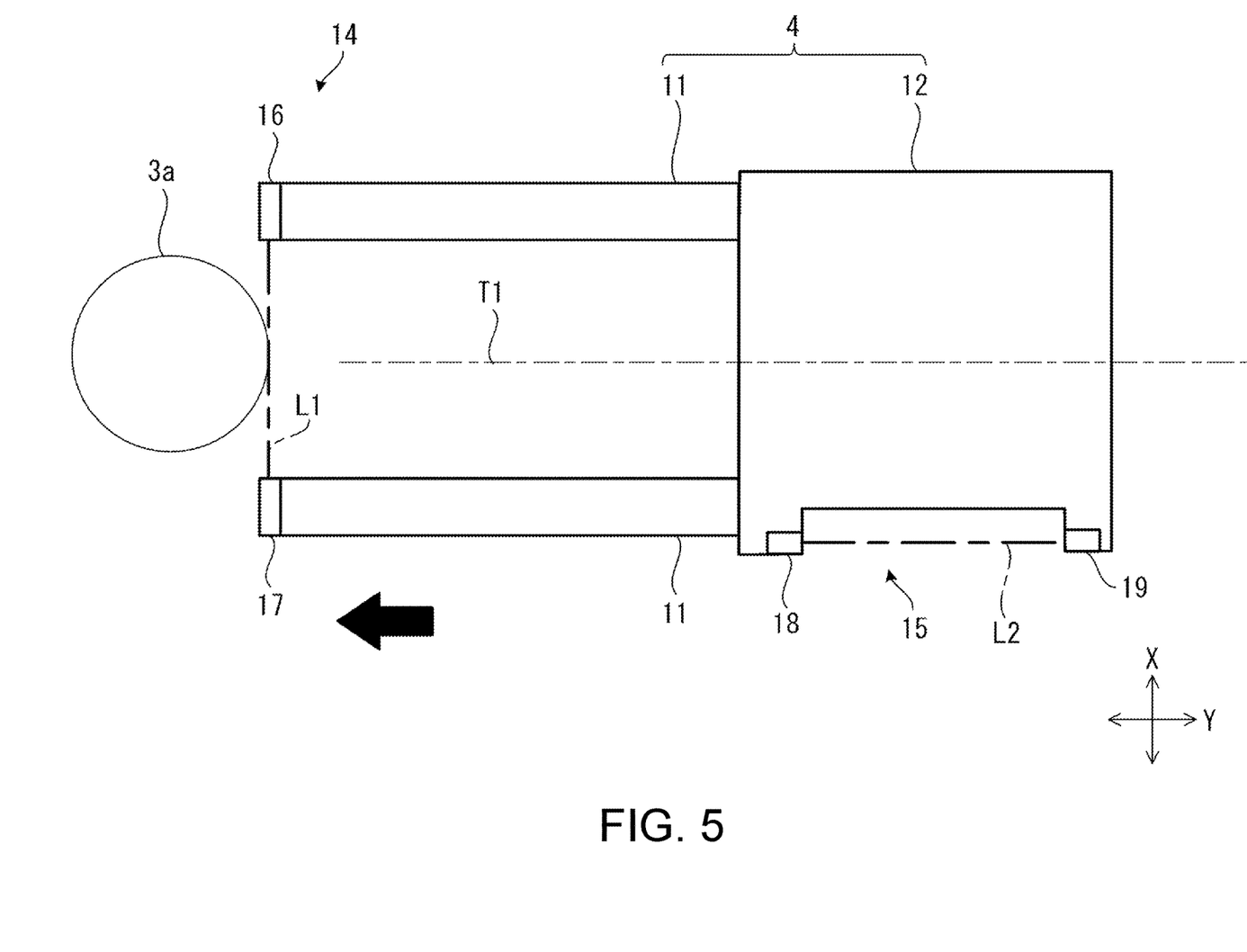
FIG. 5 is a diagram showing an operation of the hand 4 when the robot 1 shown in FIG. 1 detects a position of the first loading portion 3a in a front-rear direction.
Figure 6:
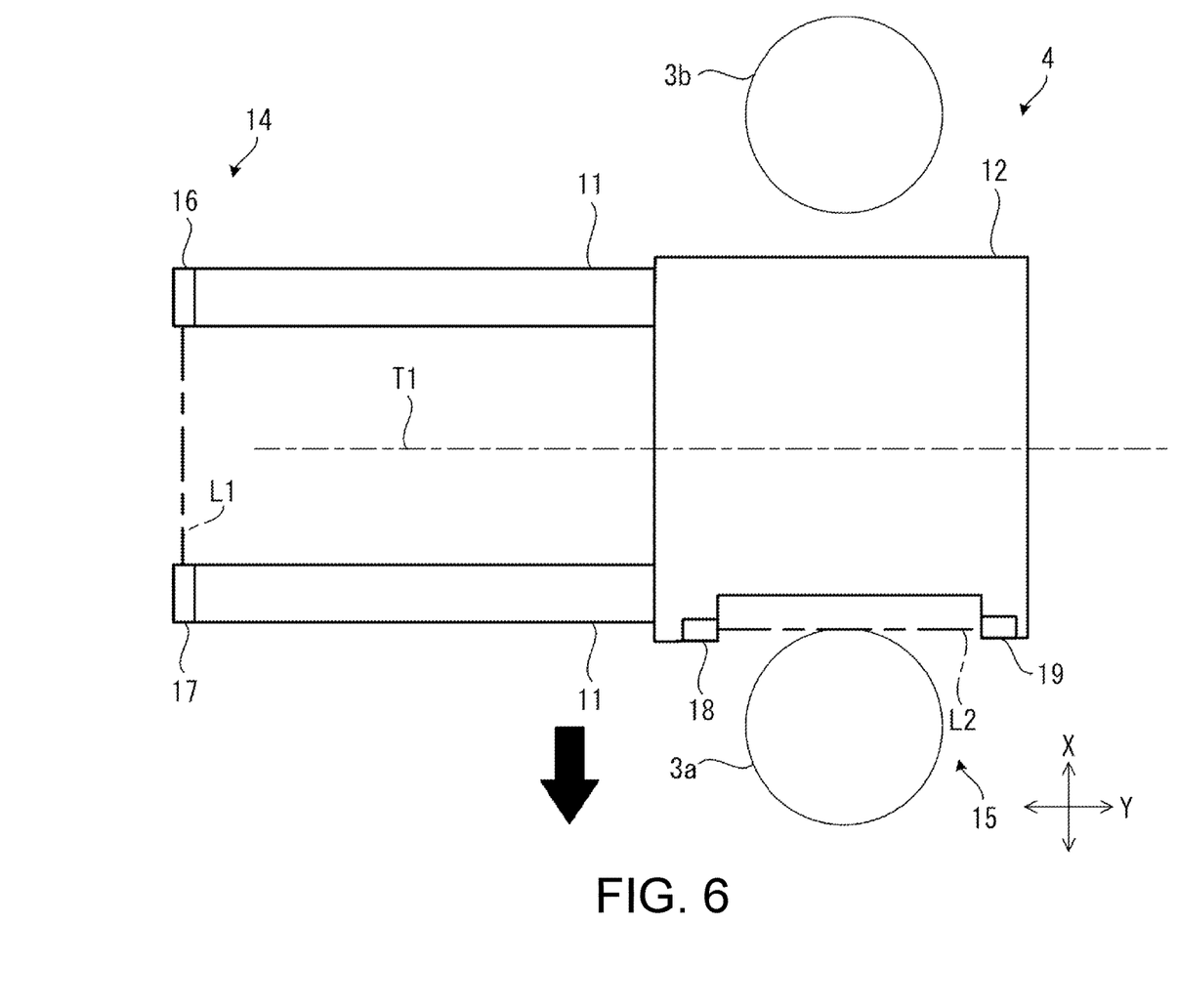
FIG. 6 is a diagram showing an operation of the hand 4 when the robot 1 shown in FIG. 1 detects a position of the first loading portion 3a in a left-right direction.
Figure 7:
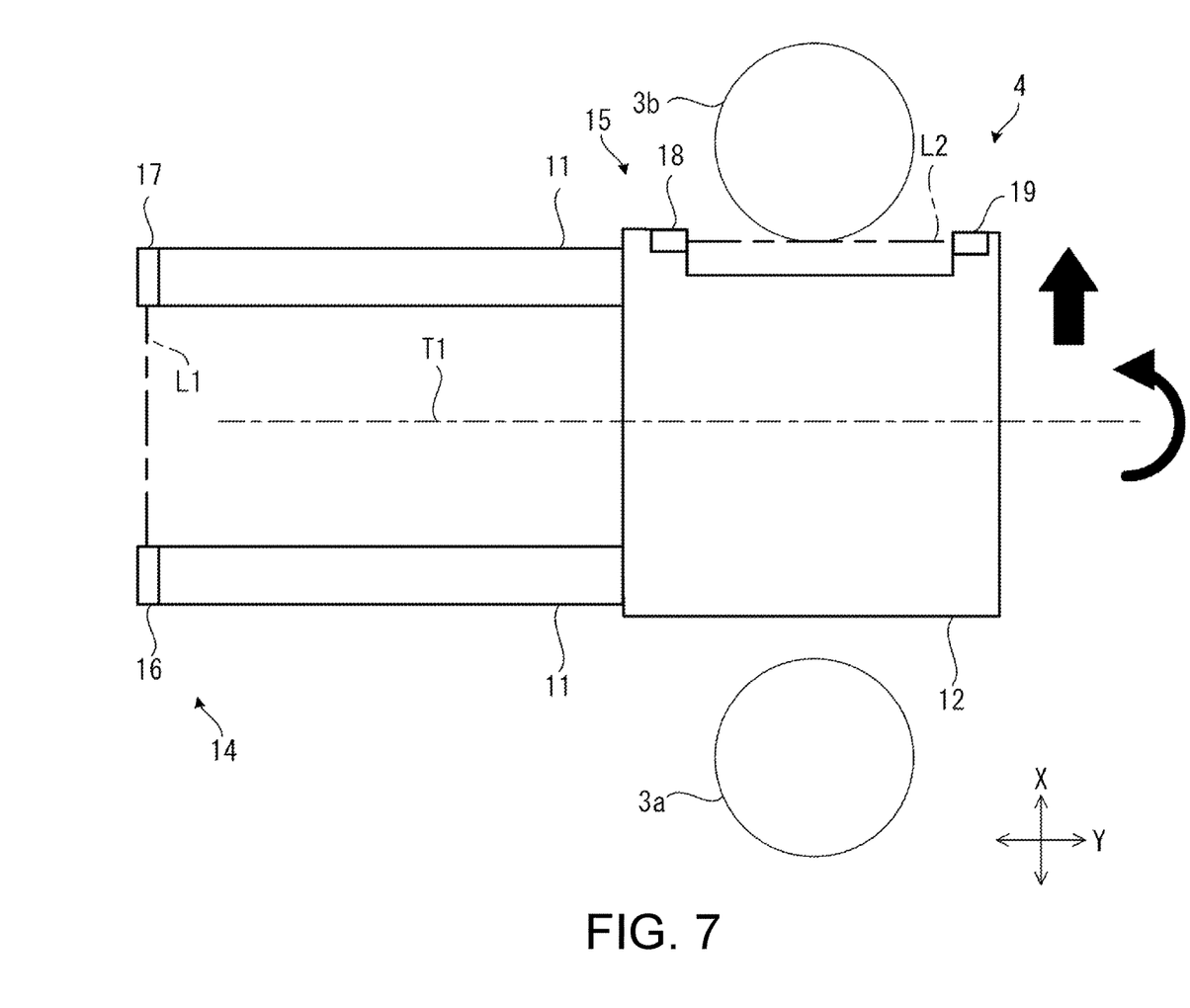
FIG. 7 is a diagram showing an operation of the hand 4 when the robot 1 shown in FIG. 1 detects a position of a second loading portion 3b in a left-right direction.

FIG. 4 is a diagram showing an operation of the hand 4 when the robot 1 shown in FIG. 1 detects a position of the first loading portion 3a in the vertical direction. FIG. 5 is a diagram showing an operation of the hand 4 when the robot 1 shown in FIG. 1 detects a position of the first loading portion 3a in the front-rear direction. FIG. 6 is a diagram showing an operation of the hand 4 when the robot 1 shown in FIG. 1 detects a position of the first loading portion 3a in the left-right direction. FIG. 7 is a diagram showing an operation of the hand 4 when the robot 1 shown in FIG. 1 detects a position of the second loading portion 3b in the left-right direction. Herein, a case is described in which positions of the two horizontally aligned first and second loading portions 3a and 3b are detected as the loading portion 3.

In the present embodiment, automatic teaching is performed in which positions of wafers (e.g., wafers 2) to be loaded on the first loading portion 3a and the second loading portion 3b are automatically taught to the robot 1, based on detection results on positions of the first loading portion 3a and the second loading portion 3b in the vertical direction, in the front-rear direction, and in the left-right direction. Specifically, in the present embodiment, when positions of wafers to be loaded on the first loading portion 3a and the second loading portion 3b are taught to the robot 1, positions of the first loading portion 3a and the second loading portion 3b in the vertical direction, in the front-rear direction, and in the left-right direction are detected.

Specifically, as shown in FIG. 4, a position of the first loading portion 3a in the vertical direction is detected by the first sensor 14 by raising and lowering the hand 4 by the elevation mechanism 8 in such a way that the optical axis L1 of the first sensor 14 passes through the first loading portion 3a. More specifically, a position of a lower surface or an upper surface of the first loading portion 3a is detected by the first sensor 14 by raising and lowering the hand 4 by the elevation mechanism 8. A position of the second loading portion 3b in the vertical direction can also be detected by a method similar to the above.

When positions of the first loading portion 3a and the second loading portion 3b in the vertical direction are the same, the detected position of the first loading portion 3a in the vertical direction may be recognized as the position of the second loading portion 3b in the vertical direction, and a detection operation of a position of the second loading portion 3b in the vertical direction may be omitted.

As shown in FIG. 5, a position of the loading portion 3 in the front-rear direction is detected by the first sensor 14 by moving the hand 4 in the front-rear direction by the moving mechanism 9 in such a way that the optical axis L1 of the first sensor 14 passes through the loading portion 3. More specifically, a position on a side surface of the loading portion 3 is detected by the first sensor 14 by moving the hand 4 in the front-rear direction by the moving mechanism 9. A position of the second loading portion 3b in the front-rear direction can also be detected by a method similar to the above.

As shown in FIG. 6, a position of the first loading portion 3a in the left-right direction is detected by the second sensor 15 by moving the hand 4 between the first loading portion 3a and the second loading portion 3b, and then, moving the hand 4 in the left-right direction by the moving mechanism 9 in such a way that the optical axis L2 of the second sensor 15 passes through the first loading portion 3a. More specifically, a position on a side surface of the first loading portion 3a is detected by the second sensor 15 by moving the hand 4 in the left-right direction by the moving mechanism 9.

As shown in FIG. 7, a position of the second loading portion 3b in the left-right direction is detected by the second sensor 15 by reversing the hand 4 around the rotation axis T1 by the rotation mechanism 10 from the state shown in FIG. 6, and moving the hand 4 in the left-right direction by the moving mechanism 9 in such a way that the optical axis L2 of the second sensor 15 passes through the second loading portion 3b. More specifically, a position on a side surface of the second loading portion 3b is detected by the first sensor 14 by moving the hand 4 in the left-right direction by the moving mechanism 9. This makes it possible to detect positions of the first loading portion 3a and the second loading portion 3b, while reducing a moving range of the hand 4.

Position detection in the vertical direction shown in FIG. 4, position detection in the front-rear direction shown in FIG. 5, and position detection in the left-right direction shown in FIGS. 6 and 7 can be performed in any order. As one example, position detection in the left-right direction shown in FIGS. 6 and 7 can be performed by first adjusting a position of the hand 4 in the vertical direction by performing position detection in the vertical direction shown in FIG. 4, and then, roughly recognizing a position of an object to be taught (e.g., the first loading portion 3a) by performing position detection in the front-rear direction shown in FIG. 5.

Alternatively, position detection in the front-rear direction shown in FIG. 5 may be performed by first adjusting a position of the hand 4 in the vertical direction by performing position detection in the vertical direction shown in FIG. 4, and then, roughly recognizing a position of an object to be taught (e.g., the first loading portion 3a) by performing position detection in the left-right direction shown in FIGS. 6 and 7. Also, when a rough position of an object to be taught in the vertical direction is known, position detection in the vertical direction shown in FIG. 4 may be performed after position detection in the front-rear direction shown in FIG. 5 and position detection in the left-right direction shown in FIGS. 6 and 7.

[Main Advantageous Effects of Present Embodiment]

In this way, in the present embodiment, the hand 4 includes the second sensor 15 in which the optical axis of the light emitting element and the optical axis of the light receiving element are parallel to the front-rear direction (first direction), in addition to the first sensor 14 in which the optical axis of the light emitting element and the optical axis of the light receiving element are parallel to the left-right direction (second direction).

This allows, for example, after position detection of the loading portion 3 in the front-rear direction is performed first by using the first sensor 14, position detection of the loading portion 3 in the left-right direction can be performed by using the second sensor 15, without substantially changing a posture (orientation) of the hand 4. Alternatively, after position detection of the loading portion 3 in the left-right direction is performed first by using the second sensor 15, position detection of the loading portion 3 in the front-rear direction can be performed by using the first sensor 14 without substantially changing a posture (orientation) of the hand 4. Therefore, it is possible to reduce the entry angle of the hand 4 (swing width of the hand 4) required for teaching. This makes it possible to teach in a narrow place.

Alternatively, providing the rotation mechanism 10 that rotates the hand 4 around the rotation axis T1 parallel to the front-rear direction (first direction) allows position detection of the second loading portion 3b in the left-right direction by reversing the hand 4 around the rotation axis T1 by the rotation mechanism 10, after position detection of the first loading portion 3a in the left-right direction is performed. This allows position detection of the first loading portion 3a and the second loading portion 3b, while reducing a moving range of the hand 4, even if the second sensor 15 is provided on only one of side surfaces of the hand 4, when there is a plurality of objects to be taught (e.g., the first loading portion 3a and the second loading portion 3b).

Other Embodiments

The above-described embodiment is one example of a preferred embodiment according to the present invention. However, the embodiment is not limited to the above, and various modifications can be implemented to the extent that the gist of the present invention is not changed.

In the above-described embodiment, the first sensor 14 and the second sensor 15 detect, for example, a position of the loading portion 3 in the vertical direction, a position of the loading portion 3 in the front-rear direction, and a position of the loading portion 3 in the left-right direction, and teach a position of the wafer 2 to be loaded on the loading portion 3 to the robot 1, based on detection results thereof. In addition to the above, for example, when a position of the wafer 2 to be loaded on the loading portion 3 is taught to the robot 1, a teaching jig may be loaded on the loading portion 3. In this case, similarly to the above-described embodiment, a position of the teaching jig in the vertical direction, a position of the teaching jig in the front-rear direction, and a position of the teaching jig in the left-right direction are detected by the first sensor 14 and the second sensor 15, and a position of the wafer 2 to be loaded on the loading portion 3 is taught to the robot 1, based on detection results thereof.

In the above-described embodiment, the wafer 2 is loaded on an upper surface of the hand 4 (specifically, upper surfaces of the two fork portions 11), and gripped thereon. In addition to the above, for example, the wafer 2 may be gripped by the hand 4 by fixing the wafer 2 to a predetermined wafer holder, allowing the two fork portions 11 to be movable in the left-right direction, and holding a predetermined portion of the wafer holder between the two fork portions 11. Specifically, the wafer 2 may be gripped by the hand 4 via the wafer holder. Also, in this case, a predetermined portion of the wafer holder may be loaded on the loading portion 3. Specifically, the wafer 2 may be loaded on the loading portion 3 via the wafer holder.

In the above-described embodiment, the first sensor 14 and the second sensor 15 are transmissive optical sensors. Alternatively, the first sensor 14 and the second sensor 15 may be reflective optical sensors.

In the above-described embodiment, the loading portion 3 is formed into a disk shape. Alternatively, the loading portion 3 may be formed into a shape other than a disk shape. For example, the loading portion 3 may be formed into an elliptical plate shape, a polygonal plate shape such as a square plate shape, or a block shape having a predetermined shape. Also, when the loading portion 3 is formed into a shape other than a disk shape, a position of the teaching jig in the vertical direction, a position of the teaching jig in the front-rear direction, and a position of the teaching jig in the left-right direction may be detected by the first sensor 14 and the second sensor 15 by loading a teaching jig on the loading portion 3, and a position of the wafer 2 to be loaded on the loading portion 3 may be taught to the robot 1, based on detection results thereof.

In the above-described embodiment, the robot 1 may include an expansible arm having a distal end to which the hand 4 is pivotably connected. In this case, a base end of the arm is pivotably connected to the pillar portion 5. Also, by an expanding and contracting operation of the arm, the hand 4 is linearly moved in the front-rear direction. Also, in the above-described embodiment, the robot 1 may include a pivot mechanism that pivotally rotates the pillar portion 5 around the vertical direction as a direction of a pivotal rotation axis. Also, in the above-described embodiment, a transport object to be transported by the robot 1 is the wafer 2. Alternatively, a transport object to be transported by the robot 1 may be anything other than the wafer 2, such as a glass substrate.

Figure 8:
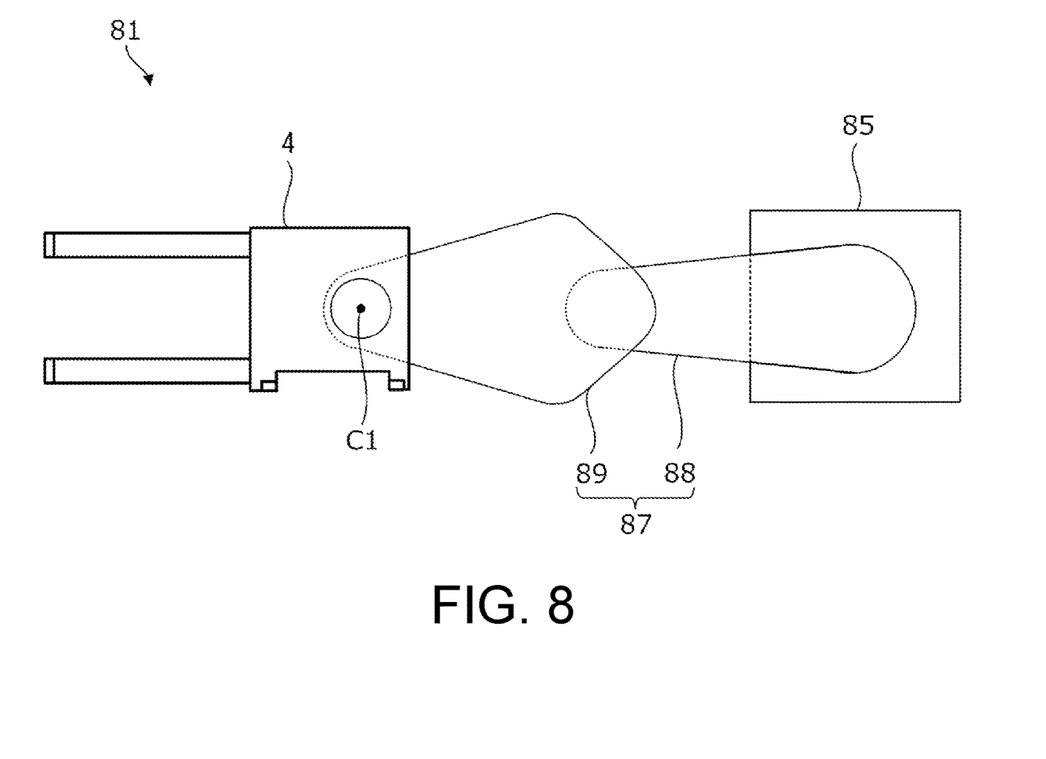
FIG. 8 is a plan view showing one example of a horizontal articulated robot to which the hand 4 is applied.

A configuration in which the above-described hand 4 is applied to the robot 1 has been described. However, the hand 4 is not limited to the robot 1, but can be applied to various types of robots having a hand that transports a transport object such as the wafer 2, and in which teaching (automatic teaching) is performed. FIG. 8 is a plan view showing one example of a horizontal articulated robot to which the hand 4 is applied. The above-described hand 4 can also be applied to an industrial robot 81 shown in FIG. 8, for example.

The industrial robot 81 is a horizontal articulated robot for transporting a wafer 2 as a transport object. The industrial robot 81 includes a hand 4 on which the semiconductor wafer 2 is loaded, an arm 87 having a distal end to which the hand 4 is pivotably connected, and a body portion 85 to which a base end of the arm 87 is pivotably connected.

The body portion 85 is formed into a substantially rectangular prismatic shape. An arm elevation mechanism (not shown) that raises and lowers the arm 87 is accommodated inside the body portion 85. The arm 87 is constituted of a first arm portion 88 and a second arm portion 89. The first arm portion 88 and the second arm portion 89 are formed into a hollow shape. A base end of the first arm portion 88 is pivotably connected to the body portion 85. A base end of the second arm portion 89 is pivotably connected to a distal end of the first arm portion 88. The industrial robot 81 also includes a first arm drive mechanism (not shown) that pivotally rotates the first arm portion 88 around the body portion 85, and a second arm drive mechanism (not shown) that pivotally rotates the second arm portion 89 around the first arm portion 88.

The hand 4 is pivotably connected to a distal end of the second arm portion 89. The hand 4 is made pivotally rotatable around a pivot center C1 (see FIG. 1) when viewed from the vertical direction. The body portion 85, the first arm portion 88, the second arm portion 89, and the hand 4 are disposed in this order from the lower side in the vertical direction. The industrial robot 81 is also provided with a hand drive mechanism (not shown) including a motor for pivotally rotating the hand 4.

Also in the industrial robot 81 as described above, teaching using the hand 4 can be performed in a similar manner as the robot 1.

As described above, the following matters are disclosed in the present specification.

(1) An industrial robot that carries a transport object into a loading portion where the transport object is loaded and carries the transport object out of the loading portion, including: a hand that grips the transport object, and linearly moves in a horizontal direction; a moving mechanism that moves the hand in the first direction and the second direction, wherein a moving direction of the hand when the transport object is transported to the loading portion is set as a first direction, and a direction orthogonal to the first direction and a vertical direction is set as a second direction; and a first sensor and a second sensor including a light emitting element and a light receiving element, and mounted on the hand, wherein the first sensor is disposed in such a way that an optical axis of the light emitting element and an optical axis of the light receiving element of the first sensor are parallel to the second direction, the second sensor is disposed in such a way that an optical axis of the light emitting element and an optical axis of the light receiving element of the second sensor are parallel to the first direction, and when a position of the transport object to be loaded on the loading portion is taught, a position of the loading portion or a teaching jig to be loaded on the loading portion in the first direction is detected by the first sensor by moving the hand in the first direction by the moving mechanism, and a position of the loading portion or the teaching jig in the second direction is detected by the second sensor by moving the hand in the second direction by the moving mechanism.

With the configuration (1), for example, after position detection of the loading portion in the first direction is performed first by using the first sensor, it is possible to perform position detection of the loading portion in the second direction by using the second sensor, without substantially changing a posture (orientation) of the hand. Alternatively, after position detection of the loading portion in the second direction is performed first by using the second sensor, it is possible to perform position detection of the loading portion in the first direction by using the first sensor, without substantially changing a posture (orientation) of the hand. Therefore, it is possible to reduce the entry angle of the hand (swing width of the hand) required for teaching. This makes it possible to teach in a narrow place.

(2) The industrial robot according to (1), further including: an elevation mechanism that raises and lowers the hand, wherein when a position of the transport object to be loaded on the loading portion is taught, a position of the loading portion or the teaching jig in a vertical direction is detected by the first sensor by raising and lowering the hand by the elevation mechanism.

With the configuration (2), it is also possible to teach a position of the transport object to be loaded on the loading portion in the vertical position.

(3) The industrial robot according to (1) or (2), further including: a rotation mechanism that rotates the hand around a rotation axis parallel to the first direction, wherein the second sensor is provided on one of both side surfaces of the hand when the first direction is set as a front-rear direction, the loading portion includes a first loading portion and a second loading portion whose positions in a horizontal direction are different from each other, and when a position of each of transport objects to be loaded on the first loading portion and the second loading portion is taught, a position of the first loading portion or a teaching jig to be loaded on the first loading portion in the second direction is detected by the second sensor by moving the hand in the second direction by the moving mechanism, and thereafter, a position of the second loading portion or a teaching jig to be loaded on the second loading portion in the second direction is detected by the second sensor by reversing the hand around the rotation axis by the rotation mechanism, and moving the hand in the second direction by the moving mechanism.

With the configuration (3), it is possible to perform position detection of the second loading portion in the left-right direction by reversing the hand by the rotation mechanism, after position detection of the first loading portion in the left-right direction is performed. This allows position detection of the first loading portion and the second loading portion, while reducing a moving range of the hand, even if the second sensor is provided on only one of side surfaces of the hand when there is a plurality of objects to be taught.

What is claimed is:

1. An industrial robot that carries a transport object to a loading portion where the transport object is to be loaded and carries the transport object from the loading portion, wherein the loading portion that is a stage has a disk shape on which the transport object is loaded and is disposed inside a processing device that performs predetermined processing with respect to the transport object, comprising:
   a hand that grips the transport object, and linearly moves in a horizontal direction;
   a moving mechanism including a first motor that moves the hand in a first direction and a second direction, wherein a moving direction of the hand when the transport object is transported to the loading portion is set as the first direction, and a direction orthogonal to the first direction and a vertical direction is set as the second direction; and
   a first sensor and a second sensor comprising a light emitting element and a light receiving element respectively, and mounted on the hand,
   wherein
   the hand includes two fork portions and a fork support portion to which base ends of the fork portions are mounted,
   the light emitting element of the first sensor is mounted on a distal end of one of the two fork portions and the light receiving element of the first sensor is mounted on a distal end of an other of the two fork portions so that the first sensor is disposed in such a way that an optical axis of the light emitting element and an optical axis of the light receiving element of the first sensor are parallel to the second direction,
   the light emitting element and the light receiving element of the second sensor are arranged on a side surface of the fork support portion wherein the side surface of the fork support portion is perpendicular to the horizontal direction of the hand, so that the light emitting element and the light receiving element of the second sensor face each other in the first direction, and the second sensor is disposed in such a way that an optical axis of the light emitting element and an optical axis of the light receiving element of the second sensor are parallel to the first direction, and
   when a position of the transport object to be loaded on the loading portion is taught, a position of the loading portion or a teaching jig to be loaded on the loading portion in the first direction is detected by the light emitting element and the light receiving element of the first sensor by moving the hand in the first direction by the moving mechanism, and
   a position of the loading portion or the teaching jig in the second direction is detected by the light emitting element and the light receiving element of the second sensor arranged on the side surface of the fork support portion by moving the hand in the second direction by the moving mechanism.

2. The industrial robot according to claim 1, further comprising:
   an elevation mechanism that raises and lowers the hand, wherein
   when a position of the transport object to be loaded on the loading portion is taught, a position of the loading portion or the teaching jig in a vertical direction is detected by the first sensor by raising and lowering the hand by the elevation mechanism.

3. The industrial robot according to claim 1, further comprising:
   a rotation mechanism including a second motor that rotates the hand around a rotation axis parallel to the first direction, wherein
   the second sensor is provided on one of both side surfaces of the hand when the first direction is set as a front-rear direction,
   the loading portion comprises a first loading portion and a second loading portion whose positions in a horizontal direction are different from each other, and
   when a position of each of transport objects to be loaded on the first loading portion and the second loading portion is taught, a position of the first loading portion or a teaching jig to be loaded on the first loading portion in the second direction is detected by the second sensor by moving the hand in the second direction by the moving mechanism, and thereafter, a position of the second loading portion or a teaching jig to be loaded on the second loading portion in the second direction is detected by the second sensor by reversing the hand around the rotation axis by the rotation mechanism, and moving the hand in the second direction by the moving mechanism.

4. The industrial robot according to claim 2, further comprising:
- a rotation mechanism including a second motor that rotates the hand around a rotation axis parallel to the first direction, wherein
- the second sensor is provided on one of both side surfaces of the hand when the first direction is set as a front-rear direction,
- the loading portion comprises a first loading portion and a second loading portion whose positions in a horizontal direction are different from each other, and
- when a position of each of transport objects to be loaded on the first loading portion and the second loading portion is taught, a position of the first loading portion or a teaching jig to be loaded on the first loading portion in the second direction is detected by the second sensor by moving the hand in the second direction by the moving mechanism, and thereafter, a position of the second loading portion or a teaching jig to be loaded on the second loading portion in the second direction is detected by the second sensor by reversing the hand around the rotation axis by the rotation mechanism, and moving the hand in the second direction by the moving mechanism.

* * * * *